(12) United States Patent
Errico et al.

(10) Patent No.: US 11,979,143 B2
(45) Date of Patent: May 7, 2024

(54) ELECTRONIC CIRCUIT TESTING METHODS AND SYSTEMS

(71) Applicant: STMicroelectronics S.r.l., Agrate Brianza (IT)

(72) Inventors: Nicola Errico, Rho (IT); Valerio Bendotti, Vilminore di Scalve (IT); Luca Finazzi, Bergamo (IT); Gaudenzia Bagnati, Pogliano Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/870,173

(22) Filed: Jul. 21, 2022

(65) Prior Publication Data

US 2023/0043943 A1 Feb. 9, 2023

(30) Foreign Application Priority Data

Aug. 9, 2021 (IT) .......................... 102021000021572

(51) Int. Cl.
*H03K 17/16* (2006.01)
*H02M 3/158* (2006.01)

(52) U.S. Cl.
CPC .......... *H03K 17/162* (2013.01); *H02M 3/158* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS 10,747,254 B1 * 8/2020 Fang ...................... G05F 3/245
2016/0118894 A1   4/2016 Zhang et al.

FOREIGN PATENT DOCUMENTS

JP        2018093344 A * 6/2018
JP        2018093344 A   6/2018

* cited by examiner

*Primary Examiner* — Metasebia T Retebo
*Assistant Examiner* — James G Yeaman
(74) *Attorney, Agent, or Firm* — Seed IP Law Group LLP (57) ABSTRACT

A circuit includes a high-side transistor pair and a low-side transistor pair having a common intermediate node. The high-side transistor pair includes a first transistor having a control node and a current flowpath therethrough configured to provide a current flow line between a supply voltage node and the intermediate node, and a second transistor having a current flowpath therethrough coupled to the control node of the first transistor. The low-side transistor pair includes a third transistor having a control node and a current flowpath therethrough configured to provide a current flow line between the intermediate node and the reference voltage node, and a fourth transistor having a current flowpath therethrough coupled to the control node of the third transistor. Testing circuitry is configured to be coupled to at least one of the second transistor and the fourth transistor to apply thereto a test-mode signal.

16 Claims, 5 Drawing Sheets

ELECTRONIC CIRCUIT TESTING METHODS AND SYSTEMS

BACKGROUND

Technical Field

The description relates to methods and systems of testing switching circuits, such as fly-back circuits, for instance.

One or more embodiments may be applied in integrated circuits (briefly, ICs) comprising power MOSFETs, such as an engine control unit (briefly, ECU) of an automotive engine management system (briefly, EMS), for instance.

Description of the Related Art

An ECU or engine control module (ECM) is an electronic control unit configured to process signals from sensors and control a series of actuators equipped on an (e.g., internal combustion) engine based on signals received from sensors equipped on the engine.

An ECU may comprise (e.g., flyback) half-bridge switching circuits comprising power transistors, e.g., in MOSFET technology.

Half-bridge switching circuits are known in the art, which may be used for driving inductive loads.

As conventional in the art, a half-bridge circuit comprises a high-side switch and a low-side switch coupled between a supply voltage node and a reference voltage node (e.g., a ground node), the two switches having an intermediate, switching node therebetween. The switches in the half-bridge circuit may comprise solid state switches such as MOS field-effect transistors.

According to known arrangements, the switching circuit may be provided within an integrated circuit (IC). The (e.g., inductive) load, usually external to the half-bridge circuit, may be connected between the supply voltage node and the intermediate node of the half-bridge circuit in a so-called "low-side driver" configuration, or between the intermediate node of the half-bridge circuit and the reference voltage node in a so-called "high-side driver" configuration.

According to known driving schemes, the high-side switch and the low-side switch may be driven by respective complementary control signals switching between a high value ("1," e.g., to close the switch) and a low value ("0," e.g., to open the switch).

The half-bridge circuit can be configured to discharge an external (e.g., inductive) load when the output is switched-off. In order to do so, the low-side and/or high-side transistors can have a relatively big die size.

These transistors may be subject to reliability tests during which relatively high voltages may be applied. The test may involve voltage levels equal or higher absolute maximum rating (briefly, AMR) parameters, that is a maximum voltage that an electronic component can sustain without damage between its (e.g., drain-source) terminals.

For instance, a drain stress test may involve applying at hot temperature (e.g., about 150-175 degrees) a drain-source voltage at least equal to the AMR of the power MOS for a certain time and to measure leakage before and after the application of the stress.

A fly-back (or clamping) circuit can feature these kind of power MOS to drive inductive loads. The clamping circuit works like a voltage regulator configure to impose on the output pin a certain voltage designed to properly discharge the inductance, with the voltage being a function of number of Zener diodes, power-MOS characteristic and driver pull-down current. In order to facilitate proper discharge of energy stored in the inductance, in particular in short time, and proper reliability during life-time of the IC, the imposed voltage is above battery voltage and below AMR of the power-MOS.

At the same time, this is in contrast with the requirement to perform drain stress at a voltage equal or above AMR. Specifically, if an input voltage equal to the power MOS AMR voltage is applied at an input node of the fly-back, its control circuit drives the power MOS to be closed; this leads to uncontrolled current flowing into the MOS channel, possibly causing destruction of the electronic component itself.

Existing solutions to meet these conflicting demands involve using a dedicated circuit to disable the fly-back circuit itself in order to counter interference thereof during execution of drain stress tests.

Existing solutions suffer one or more of the following drawbacks:
- involve additional resources on testing side in order to provide the proper voltage to the test mode pin,
- limitation of parallelism during testing,
- increase of overall testing time, possibly leading to increased manufacturing costs,
- relevant overhead of the die size allocated for the top-level routing,
- increased area footprint, possibly leading to increased costs of production,
- cold tests at wafer level (EWS) may hardly be compatible with quality tests to be performed at high temperature,
- introduction of an additional testing flow leading to increased product cost,
- waiver of high temperature for quality tests, impacting on performance levels of the application system.

BRIEF SUMMARY

The present disclosure provides one or more embodiments which contribute in overcoming the aforementioned drawbacks.

According to one or more embodiments, a circuit is provided that includes a high-side transistor pair and a low-side transistor pair having a common intermediate node. The high-side transistor pair includes: a first transistor having a control node and a current flowpath therethrough configured to provide a current flow line between a supply voltage node and the intermediate node; and a second transistor having a current flowpath therethrough coupled to the control node of the first transistor. The low-side transistor pair includes: a third transistor having a control node and a current flowpath therethrough configured to provide a current flow line between the intermediate node and the reference voltage node; and a fourth transistor having a current flowpath therethrough coupled to the control node of the third transistor. The high-side transistor pair and the low-side transistor pair are configured to supply an inductive load coupled either between the supply voltage node and the intermediate node or between the intermediate node and the reference voltage node. A drive node is configured to receive a switching drive signal, the drive node coupled to the control node of the first transistor in the high-side transistor pair and to the control node of the third transistor in the low-side transistor pair wherein the switching drive signal is applied with opposite polarities to the control node of the first transistor and to the control node of the third transistor. High-side clamping circuitry is coupled in parallel to the current flow line through the first high-side transistor, and the high-side clamping circuitry is configured to limit to a high-side clamping voltage the voltage drop between the supply voltage node and the intermediate node. Low-side clamping circuitry is coupled in parallel to the current flow line through the third low-side transistor, and the low-side clamping circuitry is configured to limit to a low-side clamping voltage the voltage drop between the intermediate node and the reference voltage node. Testing circuitry includes a test-mode node configured to receive a test-mode signal, and the testing circuitry is configured to be coupled to at least one of the second transistor in the high-side transistor pair and of the fourth transistor in the low-side transistor pair to apply thereto the test-mode signal wherein the at least one of the high-side transistor pair and the low-side transistor pair is made selectively conductive or non-conductive based on the test-mode signal.

One or more embodiments may relate to a corresponding method.

One or more embodiments may relate to a corresponding system.

An energy management system (EMS) configured to be equipped on-board an automotive (e.g., electrically powered) vehicle may be exemplary of such a system.

The claims are an integral part of the technical teaching provided herein with reference to the embodiments.

One or more embodiments envisage a relatively simple circuit, driven to switch-off a (e.g., daisy-chained or Darlington-like) transistor of the fly-back circuit via a test mode signal.

One or more embodiments provide the possibility to perform drain stress at target voltage, countering the risk of activating the fly-back circuit, in compliance with quality checks and without introducing additional resources.

One or more embodiments provide benefits on product quality and cost.

In one or more embodiments, safety-guards (e.g., redundancy or relay resistance) against malfunctioning can be put in place.

BRIEF DESCRIPTION OF THE SEVERAL VIEWS OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures annexed herein, like parts or elements are indicated with like references/numerals and a corresponding description will not be repeated for brevity.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Figure 1A:
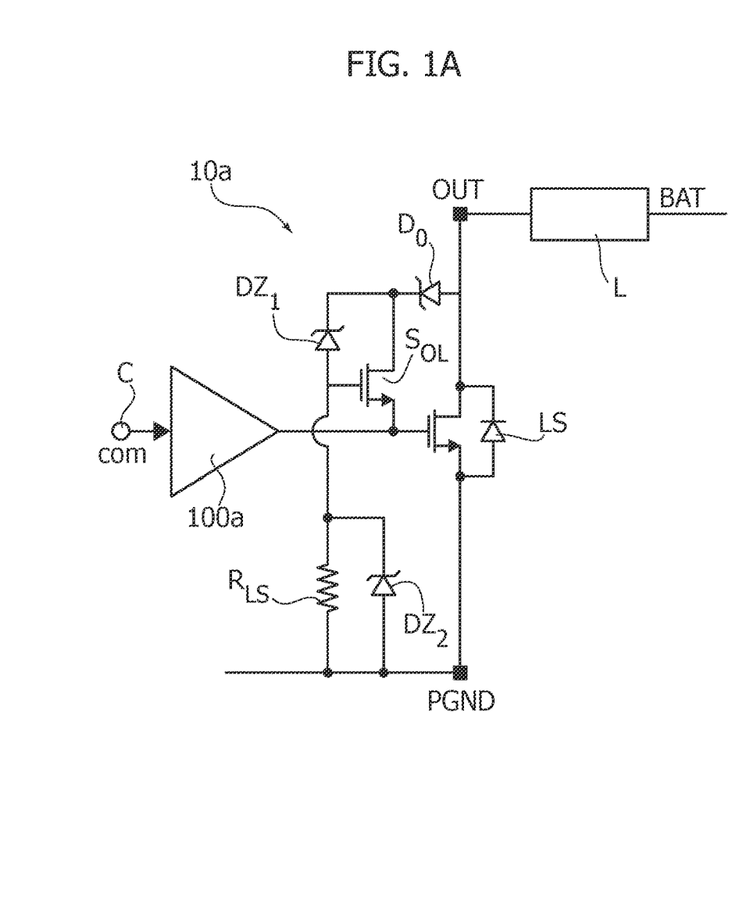
FIGS. 1A and 1B are diagrams exemplary of low-side and high-side circuit portions, respectively.
Figure 1B:
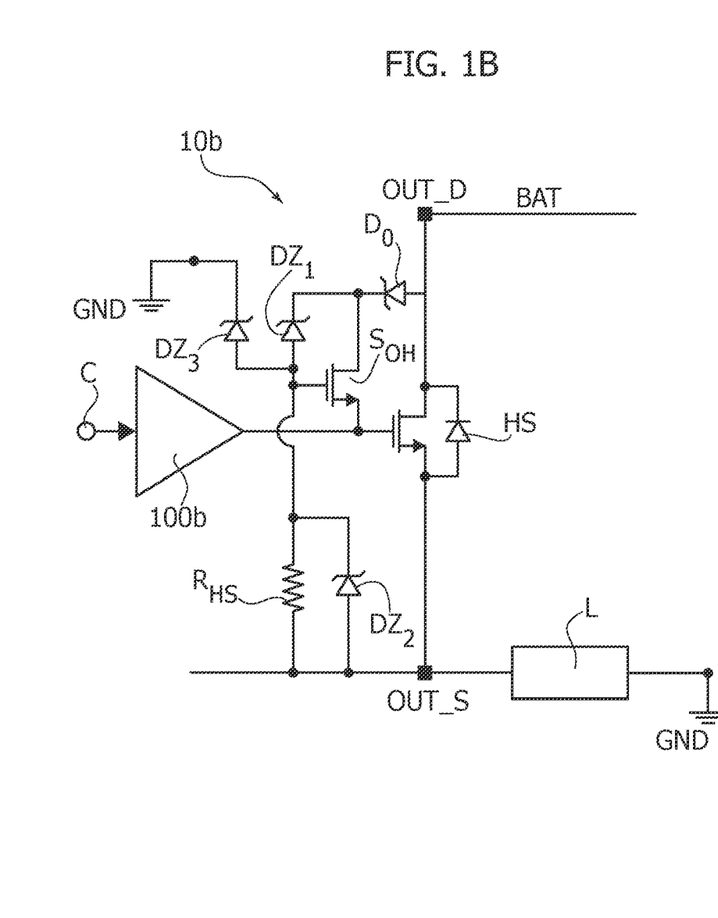

By way of introduction to the detailed description of exemplary embodiments, reference may be first made to FIGS. 1A and 1B.

FIG. 1A represents a circuit block diagram exemplary of a low-side configuration of a driver circuit 10A configured for driving a load L, in particular an inductive load L. The load L may be further coupled to a battery BAT, for instance the battery of an (e.g., electrically powered) automotive vehicle.

Figures 2, 3:
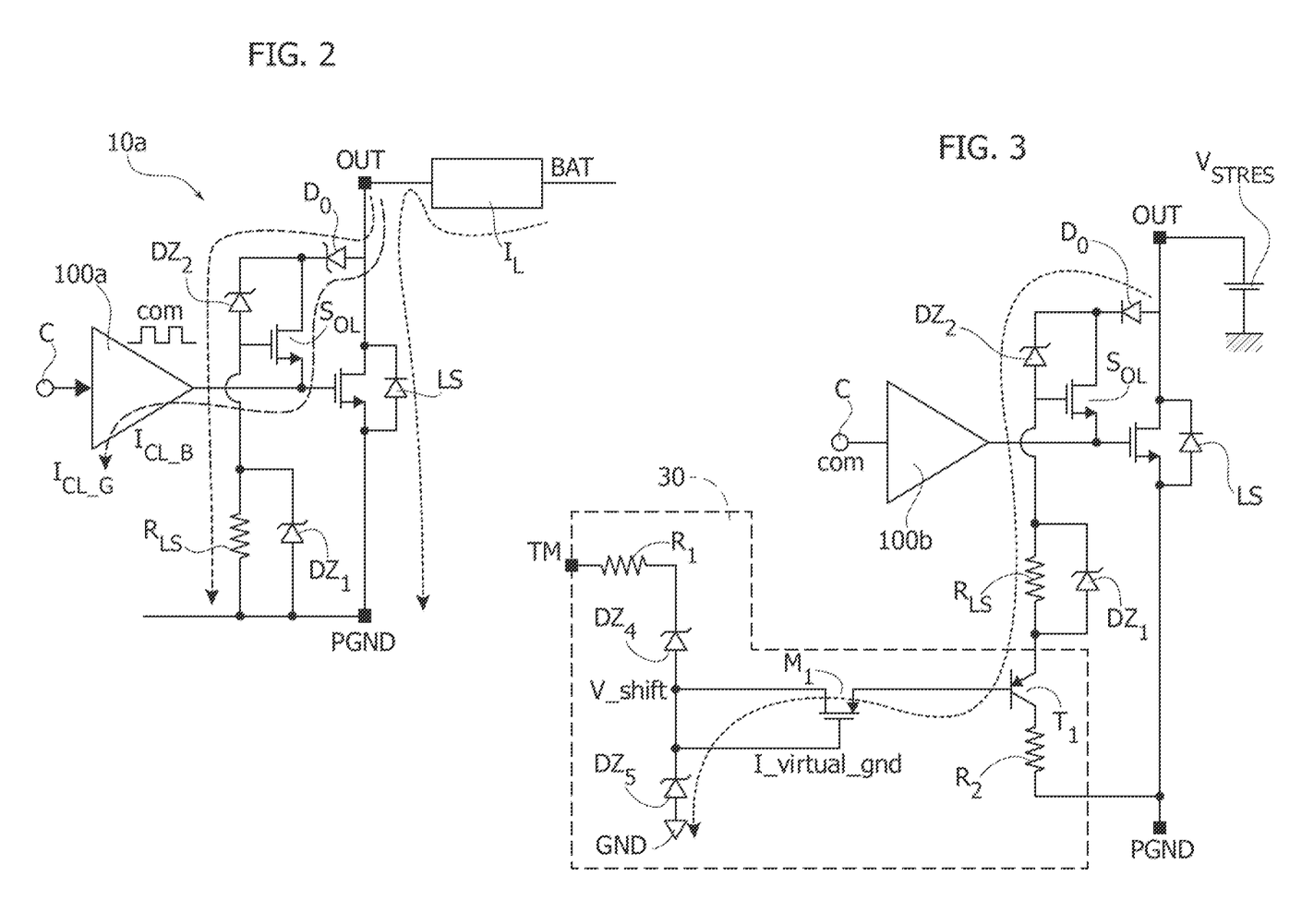
FIG. 2 is a diagram exemplary of operating the circuit exemplified in FIG. 1A.
FIG. 3 is a diagram exemplary of a conventional testing arrangement of the circuit in FIG. 1A.

As exemplified in FIG. 1A, the circuit 100 comprises:

a low-side transistor LS having a control node coupled to an amplifier 100A configured to provide a control signal thereto and a current path therethrough between a first (e.g., drain) transistor node OUT and a second (e.g., source) transistor node PGND, the current path OUT-PGND configured to be made conductive or non-conductive in response to the signal provided by the amplifier 100A and received at the control node of the low-side transistor LS having a first value or a second value, respectively, clamping circuitry comprising a further transistor $S_{OL}$ (e.g., forming a daisy-chained, Darlington-like arrangement together with the low-side transistor LS), a diode $D_0$ (e.g., intermediate the daisy-chained, Darlington-like arrangement $S_{OL}$, LS), Zener diodes $DZ_1$, $DZ_2$, and a resistance $R_{LS}$, the clamping circuitry configured to facilitate discharge of a current flowing into the inductive load L, as discussed in the foregoing with reference to FIG. 2.

FIG. 1B represents a circuit block diagram exemplary of a high-side configuration of a driver circuit 10B configured for driving a load L, in particular an inductive load L.

As exemplified in FIG. 1B, the circuit 100 comprises:

a high-side transistor HS having a control node coupled to an amplifier 100B configured to provide a control signal thereto and a current path therethrough between a first (e.g., drain) transistor node OUT_D coupled to the battery BAT and a second (e.g., source) transistor node OUT_S coupled to the inductive load L, the current path OUT_D-OUT_S configured to be made conductive or non-conductive in response to the control signal provided by the driver 100A and received at the control node of the transistor HS having a first value or a second value, respectively, clamping circuitry comprising a further transistor $S_{OH}$ (e.g., forming a daisy-chained, Darlington-like arrangement together with the high-side transistor HS), a diode $D_0$ (e.g., intermediate the daisy-chained, Darlington-like arrangement $S_{OH}$, HS), Zener diodes $DZ_1$, $DZ_2$, $DZ_3$, and a resistance $R_{LS}$, which is configured to operate in a manner substantially equal to that of FIG. 1A.

As exemplified in the Figures annexed herein, the pair of daisy-chained high-side transistors $S_{OH}$, HS and low-side transistors $S_{OL}$, LS may comprise solid state switches, such as MOS field-effect transistors, for instance.

In a conventional half-bridge circuit arrangement, the high-side switch HS and a low-side switch LS are coupled between a supply voltage node BAT and a reference voltage node GND (e.g., a ground node). The supply voltage node BAT may be configured to receive a (e.g., positive) supply voltage (e.g., from a battery) while the reference voltage node GND may be configured to receive a (e.g., negative or zero) reference voltage.

In one or more cases, the high-side (daisy-chained, Darlington-like arrangement of) pair of transistors $S_{OH}$, HS and the low-side (daisy-chained, Darlington-like arrangement of) pair of transistors $S_{OL}$, LS can be coupled via respective nodes OUT, OUT_S which become an intermediate node.

In particular:

FIG. 1A is exemplary of a low-side driver configuration 10A where the load L is connected between the supply voltage node BAT and the intermediate node OUT, and FIG. 1B is exemplary of a high-side driver configuration 10B where the load L is connected between the intermediate node OUT_S and ground GND.

As exemplified in FIGS. 1A and 1B, the amplifier 100A, 100B may comprise an input node C configured to receive a digital control signal corn which switches between a first value (e.g., "low" or "0") and a second value (e.g., "high" or "1") to drive commutation of the transistors HS, LS. For instance, the (inverting) amplifier stage 100A may propagate an inverted replica of the signal corn to the low-side transistor LS, and the (non-inverting) amplifier 100B may propagate a replica of the signal corn to the high-side switch HS. The amplifiers 100A, 100B may also bring their output signals to voltage levels adapted for driving the transistors HS, LS.

FIG. 2 is exemplary of a method of operating the LS configuration represented in FIG. 1.

As exemplified in FIG. 2, the presence of the clamping circuitry in the LS configuration makes it possible to refer to it also as a "flyback" or "clamping" circuit. This is due to its operation in discharging the (external) inductive load L, when intermediate output node OUT is switched-off, by the output itself, that is to ground PGND.

In particular, when the control signal corn received at the node C of the amplifier 100A has the first value (e.g., "low" or "0"), the current path of the low-side transistor LS between node OUT and node PGND is made conductive and the switch LS is in a first (e.g., "active") state. As a result, a discharge current $I_L$ from the inductance flows into the current flow path OUT-PGND.

As exemplified in FIG. 2, this current flow $I_L$ leads to an increase of the voltage at the first node OUT of the low-side transistor LS. In the example considered, thanks to the presence of the clamping circuitry $D_0$, $DZ_1$, $DZ_2$, $R_{LS}$, $S_{OL}$, if the voltage on the first node OUT of the low-side transistor LS exceeds a certain reference level (e.g., $V_{CLAMP}$), a bias current $I_{CL\_B}$ flows into the clamping circuitry, in particular into the resistance $R_{LS}$. As a result of this bias current flow $I_{CL\_B}$ in the resistance $R_{LS}$, the voltage $V_{RS}=I_{CL\_B}R_{LS}$ across the resistance $R_{LS}$ increases up to a gate-biasing value for the gate of the power-MOS $S_{OL}$, which is switched on as a result. In response to the switch-on of the switch $S_{OL}$, a clamping current $I_{CL\_G}$ flows into the current path through the nodes of the switch $S_{OL}$. Finally, still in the considered example, the clamping current $I_{CL\_G}$ is sourced to the control (e.g., gate) node of the switch S0L. In particular, this clamping current $I_{CL\_G}$ balances the pull-down current provided by the driver 100A in order to turn-on again power-MOS $S_{OL}$ with the gate-source bias voltage $V_{GS}$ suitable to carry load current $I_L$ provided by the discharge of the inductance L.

As exemplified in FIG. 2, the clamping circuitry $D_0$, $DZ_1$, $DZ_2$, $R_{LS}$, $S_{OL}$ can be modeled as a voltage limiter or regulator that limits the voltage level at the first node OUT of the low-side transistor at a threshold value $V_{CLAMP}$ suitable to properly discharge the inductance.

For instance, this threshold Vclamp may be set as a function of power-MOS characteristic and driver pull-down current and designed so that the voltage level at the first node OUT of the low-side transistor LS is higher than battery voltage and lower than power-MOS of AMR. In particular, the threshold voltage value $V_{CLAMP}$ may be expressed as:

$$V\text{clamp}=N*V_{DZ}+V_{BE}+V_{GS\_S0L}$$

where

N is a number of Zener diodes DZ1, DZ2, $V_{DZ}$ is the voltage limit of each Zener diode (e.g., $V_{DZ}=5$ V), $V_{BE}$ is the forward activation voltage of the diode D0, (e.g., $V_{BE}\sim0.7$ V);

$V_{GS\_S0L}$ is the bias voltage of the transistor $S_{OL}$.

Performing stress-tests on the low-side 10A and high-side 10B circuit configurations, may involve:

for the low-side circuit 10A, applying a certain stress-test voltage $V_{STRESS}$ (e.g., $V_{STRESS}>V_{CLAMP}$) to a node of the circuit 10a used for test mode purpose and to transfer this voltage shift to the clamping ground reference PGND, and/or for the high side circuit 10B, forcing a gate voltage level to keep the power MOS in an OFF state.

FIG. 3 is exemplary of a conventional arrangement configured to deactivate the clamping circuity of the low-side circuit portion 10A while performing stress tests involving voltage levels $V_{STRESS}$ at the first node OUT exceeding the threshold voltage level $V_{CLAMP}$.

As exemplified in FIG. 3, for instance, the disabling arrangement 30 comprises:

a test mode pin TM configured to receive a test-mode signal $V_{TM}$, e.g., a test voltage level $V_{TM}$ (e.g., $V_{TM}=25$ V), a first resistance R1 in series with a chain of Zener diodes $DZ_4$, $DZ_5$ comprising a first Zener diode $DZ_4$ and a second Zener diode $DZ_5$ referred to ground GND, a first transistor $M_1$ having a control node coupled to the first Zener diode $DZ_5$ and a current path therethrough between a first node coupled intermediate the chain of Zener diodes $DZ_4$, $DZ_5$ and a second node coupled to a control (e.g., base) node of a second transistor $M_2$ (e.g., a PNP BJT transistor), the second transistor (e.g., BJT) $T_2$ having a control node coupled to the second node of the first transistor $M_1$ and a current path therethrough coupled in series between the resistance $R_{LS}$, a second resistance $R_2$ and the second node PGND of the low-side transistor LS.

As exemplified in FIG. 3, the method of disabling the clamping circuitry $Dz_1$, $Dz_2$, $D_0$, $S_{OL}$, $R_{LS}$ while testing the low-side circuit LS comprises:

applying a stress test signal $V_{TM}$ at the dedicated test mode pin TM, producing a shifted voltage level Vshift, lower than the stress test $V_{TM}$ at the test pin, via the chain of Zener diodes $DZ_4$, $DZ_5$, applying the shifted voltage level Vshift at the control node (e.g., the base) of the second transistor $T_2$ in series to the clamping voltage, shifting the reference of the clamping circuit from ground PGND to the shifted voltage level Vshift itself as a result.

In this way, the voltage at which the clamping circuitry operates is raised to an increased voltage level, e.g., given by the sum of the threshold voltage Vclamp and the shifted voltage Vshift, Vclamp+Vshift. As a result, applying the stress voltage Vstress (e.g., Vclamp+Vshift>$V_{STRESS}$>Vclamp) to the second node OUT of the power transistor LS does not trigger switching-on of the power-MOS itself.

As exemplified in FIG. 3, a virtual ground current I_virtual_gnd flows in the transistors T4, M1 and the Zener diode DZ5 as a result, e.g., I_virtual_gnd=N*1 mA.

Conventional ways to deactivate the protection circuity of the high-side circuit portion 10B while performing stress tests involving voltage levels $V_{STRESS}$ at the first node OUT exceeding the threshold voltage level $V_{CLAMP}$, it is mandatory to short-circuit the control node and the second node OUT_S of the high-side power-MOS HS. For instance, this leads to automatically disable the clamping circuitry because the circuit loop is open, so that the stress test voltage level $V_{STRESS}$ can be applied. At the same time, control and second nodes of the high-side transistor HS are internal nodes hardly accessible via an integrated circuit (IC) pin, the drain stress test can be performed solely at wafer level.

For the sake of simplicity, principles underlying one or more embodiments are discussed in the following mainly with respect to a single low-side or high-side circuit portion, being otherwise understood that this discussion is purely exemplary and in no way limiting.

One or more cases may envisage a plurality of low-side 10A or high-side 10B circuit portions, for instance as in an H-bridge arrangement known per se.

In an exemplary scenario involving a plurality of low-side switches LS, the shifted voltage level Vshift can be applied to each control node of each of the LS switches, taking into account the relevant current flow (~1 mA) for coupling the arrangement 30 to each control node.

A solution as exemplified in FIG. 3 involves additional circuit resources on the testing side in order to provide the proper voltage $V_{STRESS}$ to the test mode pin TM. As a drawback, this can be a limitation for parallelism during testing. Moreover, the arrangement 30 has a non-negligible area footprint in terms of die size, as it is designed to sustain high voltage and involves dedicated routing for each LS output.

Figure 4:
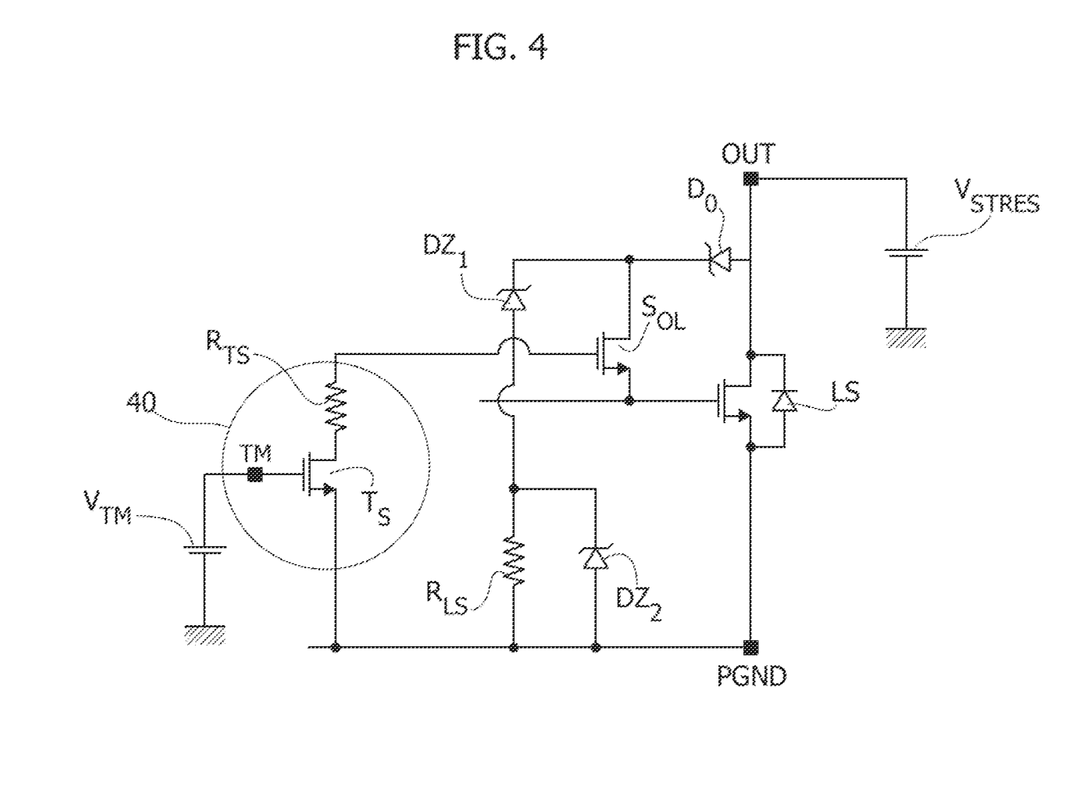
FIG. 4 is a diagram exemplary of a circuit as per the present disclosure.

As exemplified in FIG. 4, an improved disabling arrangement 40 comprises:

a test switch TS (e.g., a n-MOS transistor) having a control node TM configured to be coupled to a test voltage level $V_{TM}$ and a current path therethrough between a first node and a second node PGND, the first node coupled, via a resistance $R_{TS}$, to the control node of the transistor $S_{OL}$ and the second node coupled to the second node PGND of the low-side transistor LS.

As exemplified in FIG. 4, the test switch TS is configured to drive the first transistor $S_{OL}$ in the high-side pair of transistors $S_{OL}$, HS of the fly-back circuit 10A to make non-conductive (that is, switched "off") or conductive (that is, switched "on") the second transistor Hs in the pair of high-side transistors $S_{OL}$, HS based on the test mode signal $V_{TM}$ received at the test-mode node TM having a first (e.g., "1") or a second (e.g., "0") value, respectively.

For instance:

when drain stress test mode is enabled (e.g., $V_{TM}$="1"), the test switch TS drives the first transistor $S_{OL}$ of the fly-back circuit 10A to be switched-off to node PGND, so that the clamping regulator loop is "open" as a result, when the stress voltage level $V_{STRESS}$ is applied, a certain number of current flows into clamping circuit and the test-mode switch TS, the amount of current being limited by the resistance $R_{TS}$, countering any possible damages to the clamping circuitry.

In adapting the solution discussed with reference to FIG. 4 to the high-side transistor HS, the Inventors have observed that connecting test mode switch TS directly to the control node of the test transistor TS involves, as a drawback, that the second node OUT_S reaches negative voltage levels during circuit operation.

Figure 5:
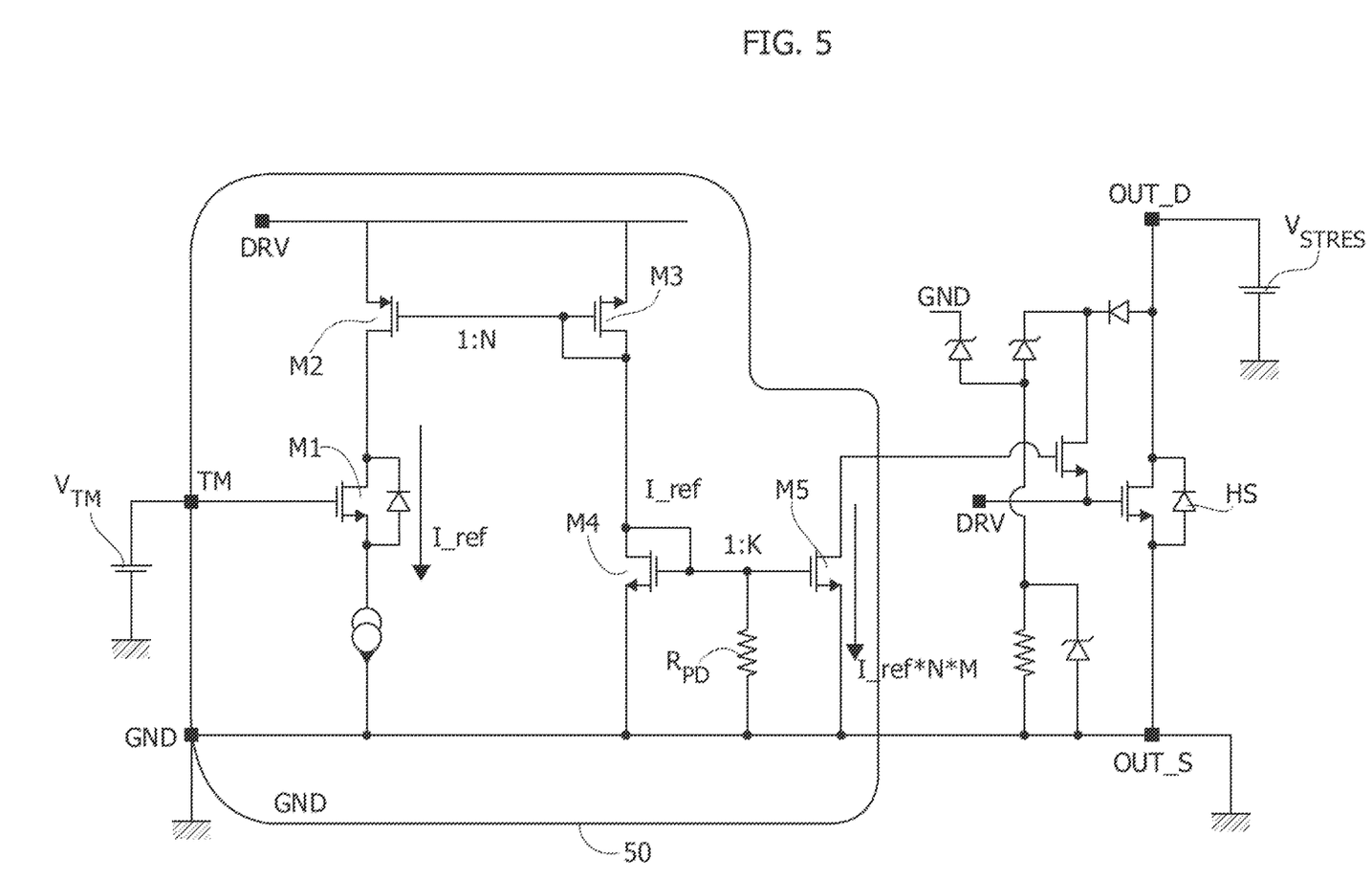
FIG. 5 is a diagram exemplary of an alternative embodiment of a circuit as per the present disclosure.

As exemplified in FIG. 5, an alternative disabling arrangement 50, in particular suitable for testing the high-side transistor HS, comprises:

a first power (e.g., MOS) transistor M1 having its control node TM configured to be coupled to the test signal level $V_{TM}$, a first current mirror arrangement of (e.g., MOS) transistors M2, M3 comprising a second transistor M2 having a current path therethrough in series with the current path through the first power transistor M1 and a third transistor M3 configured to have a current flowing into its current path that is a replica, optionally scaled by a first mirroring factor N, the current flowing into the current path of the first transistor M1, a second current mirror arrangement of (e.g., MOS) transistors M4, M5 comprising a fourth transistor M4 having a current path therethrough in series with the current path through the third transistor M3 and a fifth transistor M5 configured to have a current flowing into its current path that is a replica, optionally scaled by a second mirroring factor K, the current flowing into the current path of the first transistor M3 (which is a replica of the current flowing into the first power-transistor M1), a limiting resistance Rpd having a first resistance end coupled to the control nodes of the fourth and fifth transistors M4, M5 and a second resistance end configured to be coupled to the second node of the high-side transistor OUT_S, the resistance configured to limit any parasitic current flow, as discussed in the following.

As exemplified in FIG. 5, for instance:

the stress signal $V_{STRESS}$ is transferred using a level shifter, so that a fixed current Iref is provided through first M2, M3 and second M4, M5 current mirrors that transfer the test signal $V_{TM}$ from low voltage to OUT_S domain when drain stress test mode is activated (e.g., $V_{TM}$="1"), when stress voltage level $V_{STRESS}$ is applied at the first node of the high-side transistor HS, current flowing into clamping circuit is limited by the current mirroring arrangements M2, M3 and M4, M5, for instance to a current value $I_M$ equal to a product of a reference current Iref times the respective current mirroring factors N, k, (e.g., $I_M$=Iref*N*K), the limiting resistance Rpd counters any possible unwanted activation of the second current mirror arrangement M4,M5, e.g., when drain stress test mode is not activated.

In one or more embodiments, using the circuit of FIG. 4 or 5 it may be possible to perform drain stress tests at final test, overcoming the existing constraint of wafer-level testing.

A circuit as exemplified herein, comprises a high-side transistor pair $S_{OH}$, HS and a low-side transistor pair $S_{OL}$, LS having a common intermediate node OUT_S, OUT. For instance, the high-side transistor pair $S_{OH}$, HS comprises a first transistor HS having a control node and a current flowpath therethrough configured to provide a current flow line between a supply voltage node OUT_D and the intermediate node OUT_S (or OUT) as well as a second transistor $S_{OH}$ having a current flowpath therethrough coupled to the control node of the first transistor HS. In examples discussed herein, the low-side transistor pair $S_{OL}$, LS comprises a third transistor LS having a control node and a current flowpath therethrough configured to provide a current flow line between the intermediate node OUT, OUT_S and the reference voltage node GND as well as a fourth transistor $S_{OL}$ having a current flowpath therethrough coupled to the control node of the third transistor LS. In particular, the high-side transistor pair $S_{OH}$, HS and the low-side transistor pair $S_{OL}$, LS are configured to supply an inductive load L coupled either between the supply voltage node OUT_D, BAT and the intermediate node or between the intermediate node and the reference voltage node.

A circuit as exemplified herein, further comprises a drive node C configured to receive a switching drive signal corn, the drive node C coupled to the control node of the first transistor HS in the high-side transistor pair $S_{OH}$, HS and to the control node of the third transistor LS in the low-side transistor pair $S_{OL}$, LS wherein the switching drive signal is applied 100A, 100B with opposite polarities to the control node of the first transistor HS and to the control node of the third transistor $S_{OL}$, LS.

A circuit as exemplified herein, further comprises:
high-side clamping circuitry $DZ_1$, $DZ_2$, $R_{HS}$, $D_0$, $DZ_3$ coupled in parallel to the current flow line through the first high-side transistor HS, wherein the high-side clamping circuitry $DZ_1$, $DZ_2$, $R_{HS}$, $D_0$, $DZ_3$ is configured to limit to a high-side clamping voltage the voltage drop between the supply voltage node OUT_D and the intermediate node OUT_S, OUT, and low-side clamping circuitry $DZ_1$, $DZ_2$, $R_{LS}$ coupled in parallel to the current flow line through the third low-side transistor LS, wherein the low-side clamping circuitry $DZ_1$, $DZ_2$, $R_{LS}$ is configured to limit to a low-side clamping voltage the voltage drop between the intermediate node and the reference voltage node.

A circuit as exemplified herein, further comprises testing circuitry 40 (or 50) comprising a test-mode node TM configured to receive a test-mode signal $V_{TM}$, the testing circuitry configured to be coupled to at least one of the second transistor $S_{OH}$ in the high-side transistor pair $S_{OH}$, HS and of the fourth transistor $S_{OL}$ in the low-side transistor pair $S_{OL}$, LS to apply thereto the test-mode signal $V_{TM}$ wherein the at least one of the high-side transistor pair $S_{OH}$, HS and the low-side transistor pair $S_{OL}$, LS is made selectively conductive or non-conductive based on the test-mode signal $V_{TM}$.

As illustrated herein, the testing circuitry 40 comprises a testing transistor TS having a control node coupled to the test-mode node TM and a current flowpath therethrough between a first testing transistor node and a second testing transistor node, the first testing transistor node coupled, via a testing resistance $R_{TS}$, to the fourth transistor $S_{OL}$ in the low-side pair of transistors $S_{OL}$, LS and a second testing transistor node coupled to the reference node. For instance, the testing transistor TS is configured to drive the fourth transistor LS in the low-side transistor pair $S_{OL}$, LS, making non-conductive said current flow line of the third transistor LS in the low-side transistor pair $S_{OL}$, LS in response to the test-mode signal $V_{TM}$ having a first value during a first time interval.

As exemplified herein, the testing circuitry 50 comprises a further testing transistor M1 having a control node coupled to the test-mode node TM and a current flowpath therethrough between a first testing transistor node coupled to a first current mirror arrangement of transistors M2, M3 and a second testing transistor node coupled to a reference current generator Iref referred to ground GND. For instance, the first current mirror arrangement M2, M3 is configured to provide a mirrored current that is a scaled replica of the current flowing in the current flow path of the further testing transistor M1, the mirrored current being scaled by a first scale factor. In the considered example, a second current mirror arrangement of transistors M4, M5 is coupled to the first current mirror arrangement M2, M3 and to the second transistor $S_{OH}$ in the high-side transistor pair $S_{OH}$, HS, the second current mirror arrangement M4, M5 configured to provide a further mirrored current that is a scaled replica of the current mirrored by the first current mirror M2, M3, the further mirrored current being scaled by a second scale factor. For instance, the further testing transistor M1 is configured to drive the second transistor $S_{OH}$ in the high-side transistor pair $S_{OH}$, HS, making non-conductive said current flow path between the supply voltage node and the intermediate node in response to the test-mode signal having a first value during a first time interval.

In the considered example, the second current mirror M3, M4 comprises a limiting resistance Rpd coupled intermediate the second current mirror arrangement M4, M5 and said intermediate node.

In one or more embodiments, a half-bridge or full-bridge load driver circuit HS, LS and a disabling arrangement 40, 50 as exemplified herein may be implemented in an application-specific integrated circuit (ASIC) 100 which may be comprised, by way of example, in an energy management system (EMS) unit of an automotive vehicle, for instance an electrically powered vehicle.

Figures 6, 7:
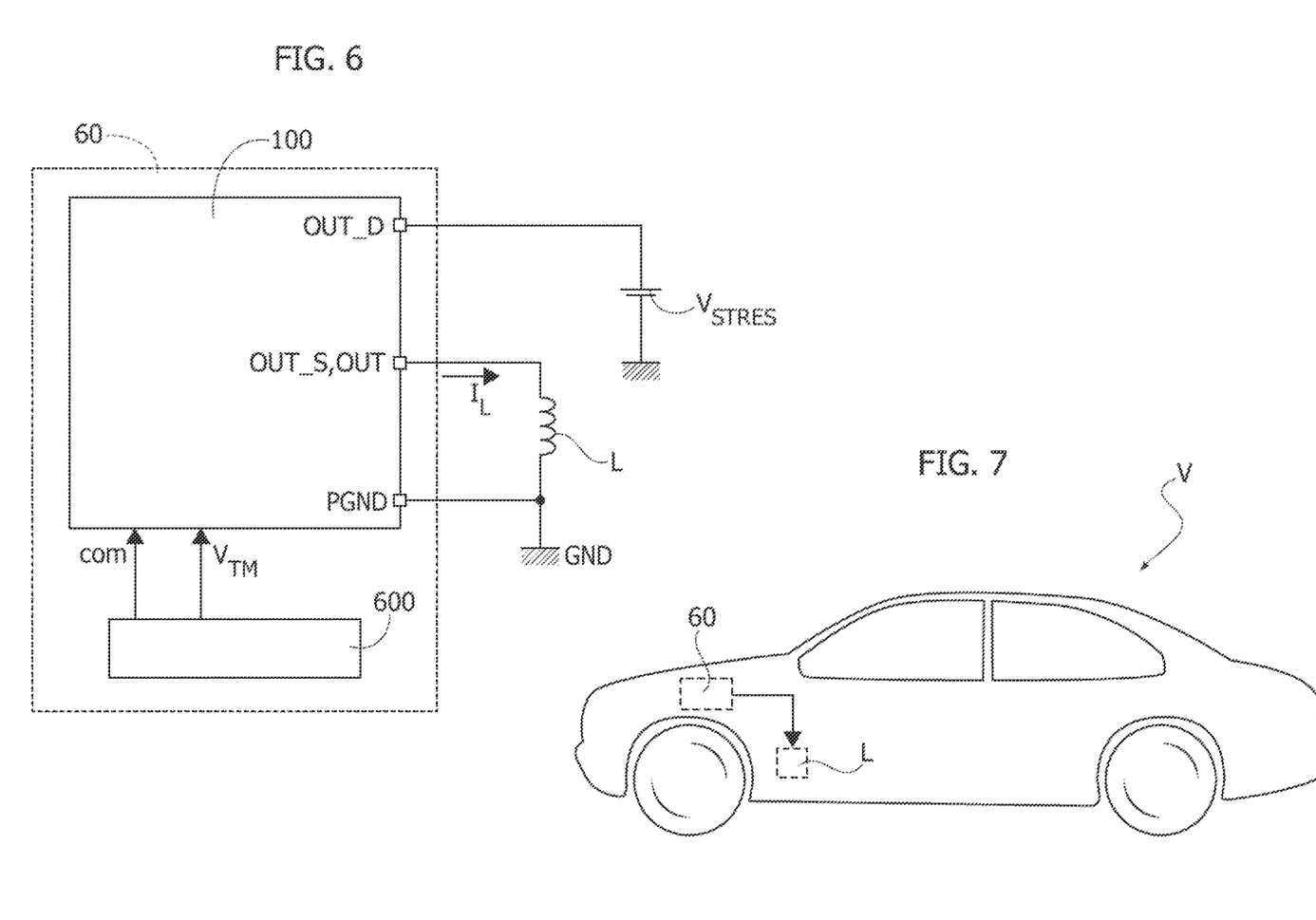
FIG. 6 is an exemplary diagram of system as per the present disclosure.
FIG. 7 is an exemplary diagram of a vehicle equipped with the system of FIG. 6.

To this regard, FIG. 6 is exemplary of one or more embodiments of a system 60 such as an energy management system (briefly, EMS) comprising a driver circuit 100 and a processing unit 600 (e.g., a microcontroller unit of a vehicle). For instance, the processing unit 600 is configured to provide the control signal corn and the test-enable signal TM to the driver circuit 100.

As exemplified herein, the high-side clamping circuitry and the low-side clamping circuitry each comprise a chain of Zener diodes $DZ_1$, $DZ_2$ coupled either between the supply voltage node and the intermediate node or between the intermediate node and said reference voltage node. For instance, the high-side clamping circuitry and the low-side clamping circuitry each further comprise a resistance $R_{LS}$, $R_{HS}$ couple in parallel with a last Zener diode $DZ_2$ in the chain of Zener diodes $DZ_1$, $DZ_2$.

In another aspect, a method of operating the circuit exemplified herein comprises applying a test-mode signal $V_{TM}$ to the test-mode node TM, the test-mode signal having a first value during a first time interval, and applying a stress voltage level $V_{STRESS}$ to at least one of said second transistor $S_{OH}$ in the high-side transistor pair $S_{OH}$, HS and fourth transistor $S_{OL}$ in the low-side transistor pair $S_{OL}$, LS during the first time interval in which the test-mode signal has the first value, wherein the stress voltage level $V_{STRESS}$ is above either the low-side or the high-side clamping voltage. For instance, the method further comprises limiting Rsw, Rpd, M1, M3 an amount of current that flows into the low-side or the high-side clamping circuitry and the testing circuitry during the first time interval in which the test-mode signal has the first value.

FIG. 7 is exemplary of one or more embodiments of a (e.g., electrically powered) vehicle V comprising a (e.g., energy management) system 60 according to the present disclosure, for instance equipped with the driver circuit 100 configured to control an inductive actuator L.

A device 60 as exemplified herein, comprises a circuit 100 as per the present disclosure and an inductive load L coupled either between said supply voltage node and said intermediate node or between said intermediate node and said reference voltage node. As exemplified herein, the device 60 further comprises an electrical supply source BAT configured to provide a voltage supply level coupled to said supply voltage node of the circuit 100. As exemplified herein, the device 60 further comprises a stress voltage source configured to provide a stress voltage level $V_{STRESS}$ either above the high-side clamping voltage or the low-side clamping voltage to at least one said supply voltage node and said intermediate node. For instance, the device 60 further comprises signal generating circuitry 600 configured to provide the test-mode signal $V_{TM}$ to the test-mode node TM.

In the considered example, the low-side transistor pair $S_{OL}$, LS and the high-side transistor pair $S_{OH}$, HS are coupled to the inductive load L at said intermediate node and form a flyback circuit arrangement.

As illustrated herein, the device 60 may be equipped onboard an automotive vehicle V, preferably an electrically powered automotive vehicle.

One or more embodiments may thus provide improved accuracy in determining failures of a driver circuit for an inductive load, which may be particularly advantageous to fulfill safety requirements in the automotive field.

For instance, an energy management system, EMS, unit configured to manage energy of the vehicle V comprises the device 60 as per the present disclosure.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

A circuit may be summarized as including a high-side transistor pair ($S_{OH}$, HS) and a low-side transistor pair ($S_{OL}$, LS) having a common intermediate node (OUT_S, OUT), wherein the high-side transistor pair ($S_{OH}$, HS) includes a first transistor (HS) having a control node and a current flowpath therethrough configured to provide a current flow line between a supply voltage node (OUT_D) and the intermediate node (OUT_S, OUT) as well as a second transistor ($S_{OH}$) having a current flowpath therethrough coupled to the control node of the first transistor (HS), wherein the low-side transistor pair ($S_{OL}$, LS) includes a third transistor (LS) having a control node and a current flowpath therethrough configured to provide a current flow line between the intermediate node (OUT, OUT_S) and the reference voltage node (PGND) as well as a fourth transistor ($S_{OL}$) having a current flowpath therethrough coupled to the control node of the third transistor (LS), and wherein the high-side transistor pair ($S_{OH}$, HS) and the low-side transistor pair ($S_{OL}$, LS) are configured to supply an inductive load (L) coupled either between the supply voltage node (OUT_D, BAT) and the intermediate node (OUT, OUT_S) or between the intermediate node (OUT, OUT_S) and the reference voltage node (PGND), a drive node (C) configured to receive a switching drive signal (corn), the drive node (C) coupled to the control node of the first transistor (HS) in the high-side transistor pair ($S_{OH}$, HS) and to the control node of the third transistor (LS) in the low-side transistor pair ($S_{OL}$, LS) wherein the switching drive signal is applied (100A, 100B) with opposite polarities to the control node of the first transistor (HS) and to the control node of the third transistor ($S_{OL}$, LS), high-side clamping circuitry ($DZ_1$, $DZ_2$, $R_{HS}$, $D_0$, $DZ_3$) coupled in parallel to the current flow line through the first high-side transistor (HS), wherein the high-side clamping circuitry ($DZ_1$, $DZ_2$, $R_{HS}$, $D_0$, $DZ_3$) is configured to limit to a high-side clamping voltage the voltage drop between the supply voltage node (OUT_D) and the intermediate node (OUT_S, OUT), low-side clamping circuitry ($DZ_1$, $DZ_2$, $R_{LS}$) coupled in parallel to the current flow line through the third low-side transistor (LS), wherein the low-side clamping circuitry ($DZ_1$, $DZ_2$, $R_{LS}$) is configured to limit to a low-side clamping voltage the voltage drop between the intermediate node (OUT, OUT_S) and the reference voltage node (PGND), and testing circuitry (40; 50) including a test-mode node (TM) configured to receive a test-mode signal ($V_{TM}$), the testing circuitry (40; 50) configured to be coupled to at least one of the second transistor ($S_{OH}$) in the high-side transistor pair ($S_{OH}$, HS) and of the fourth transistor ($S_{OL}$) in the low-side transistor pair ($S_{OL}$, LS) to apply thereto the test-mode signal ($V_{TM}$) wherein the at least one of the high-side transistor pair ($S_{OH}$, HS) and the low-side transistor pair ($S_{OL}$, LS) is made selectively conductive or non-conductive based on the test-mode signal ($V_{TM}$).

The testing circuitry (40) may include a testing transistor (TS) having a control node coupled to the test-mode node (TM) and a current flowpath therethrough between a first testing transistor node and a second testing transistor node, the first testing transistor node coupled, via a testing resistance ($R_{TS}$), to the fourth transistor (S0L) in the low-side pair of transistors ($S_{OL}$, LS) and a second testing transistor node coupled to the reference node (PGND), the testing transistor (TS) may be configured to drive the fourth transistor (LS) in the low-side transistor pair ($S_{OL}$, LS), making non-conductive said current flow line of the third transistor (LS) in the low-side transistor pair ($S_{OL}$, LS) in response to the test-mode signal ($V_{TM}$) having a first value during a first time interval.

The testing circuitry (50) may include a further testing transistor (M1) having a control node coupled to the test-mode node (TM) and a current flowpath therethrough between a first testing transistor node coupled to a first current mirror arrangement of transistors (M2, M3) and a second testing transistor node coupled to a reference current generator (Iref) referred to ground (GND), the first current mirror arrangement (M2, M3) may be configured to provide a mirrored current that may be a scaled replica of the current flowing in the current flow path of the further testing transistor (M1), the mirrored current being scaled by a first scale factor, a second current mirror arrangement of transistors (M4, M5) coupled to the first current mirror arrangement (M2, M3) and to the second transistor ($S_{OH}$) in the high-side transistor pair (S0H, HS), the second current mirror arrangement (M4, M5) configured to provide a further mirrored current that may be a scaled replica of the current mirrored by the first current mirror (M2, M3), the further mirrored current being scaled by a second scale factor, the further testing transistor (M1) may be configured to drive the second transistor ($S_{OH}$) in the high-side transistor pair (S0H, HS), making non-conductive said current flow path between said supply voltage node (OUT_D) and said intermediate node (OUT_S, OUT) in response to the test-mode signal ($V_{TM}$) having a first value during a first time interval.

The second current mirror (M3, M4) may include a limiting resistance (Rpd) coupled intermediate the second current mirror arrangement (M4, M5) and said intermediate node (OUT_S).

The high-side clamping circuitry and the low-side clamping circuitry each may include a chain of Zener diodes ($DZ_1$, $DZ_2$) coupled either between said supply voltage node (OUT_D, BAT) and said intermediate node (OUT, OUT_S) or between said intermediate node (OUT, OUT_S) and said reference voltage node (PGND), and a resistance ($R_{LS}$, $R_{HS}$) couple in parallel with a last Zener diode ($DZ_2$) in the chain of Zener diodes ($DZ_1$, $DZ_2$).

A method of operating the circuit may be summarized as including applying a test-mode signal ($V_{TM}$) to said test-mode node (TM), the test-mode signal ($V_{TM}$) having a first value during a first time interval, and applying a stress voltage level ($V_{STRESS}$) to at least one of said second transistor ($S_{OH}$) in the high-side transistor pair ($S_{OH}$, HS) and fourth transistor ($S_{OL}$) in the low-side transistor pair ($S_{OL}$, LS) during the first time interval in which the test-mode signal ($V_{TM}$) has the first value, wherein the stress voltage level ($V_{STRESS}$) is above either the low-side or the high-side clamping voltage.

The method may further include limiting (Rsw, Rpd, M1, M3) the amount of current that flows into the low-side or the high-side clamping circuitry and the testing circuitry during the first time interval in which the test-mode signal ($V_{TM}$) has the first value.

A device (60) may be summarized as including a circuit (100),
an inductive load (L) coupled either between said supply voltage node (OUT_D, BAT) and said intermediate node (OUT, OUT_S) or between said intermediate node (OUT, OUT_S) and said reference voltage node (PGND), an electrical supply source (BAT) configured to provide a voltage supply level coupled to said supply voltage node (OUT_D, BAT) of the circuit (100), a stress voltage source configured to provide a stress voltage level ($V_{STRESS}$) either above the high-side clamping voltage or the low-side clamping voltage to at least one said supply voltage node (OUT_D, BAT) and said intermediate node (OUT, OUT_S), signal generating circuitry (600) configured to provide said test-mode signal ($V_{TM}$) to said test-mode node (TM).

The low-side transistor pair ($S_{OL}$, LS) and the high-side transistor pair ($S_{OH}$, HS) may be coupled to the inductive load (L) at said intermediate node (OUT, OUT_S) and form a flyback circuit arrangement.

The device may be an energy management system, EMS, unit configured to manage energy of a vehicle (V), the EMS unit may include the device (60).

An automotive vehicle (V) equipped with the device (60), preferably an electrically powered automotive vehicle.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a high-side transistor pair and a low-side transistor pair having a common intermediate node, the high-side transistor pair including:
a first transistor having a control node and a current flowpath therethrough configured to provide a current flow line between a supply voltage node and the intermediate node; and
a second transistor having a current flowpath therethrough coupled to the control node of the first transistor,
the low-side transistor pair including:
a third transistor having a control node and a current flowpath therethrough configured to provide a current flow line between the intermediate node and the reference voltage node; and
a fourth transistor having a current flowpath therethrough coupled to the control node of the third transistor,
wherein the high-side transistor pair and the low-side transistor pair are configured to supply an inductive load coupled either between the supply voltage node and the intermediate node or between the intermediate node and the reference voltage node;
a drive node configured to receive a switching drive signal, the drive node coupled to the control node of the first transistor in the high-side transistor pair and to the control node of the third transistor in the low-side transistor pair wherein the switching drive signal is applied with opposite polarities to the control node of the first transistor and to the control node of the third transistor;
high-side clamping circuitry coupled in parallel to the current flow line through the first high-side transistor, wherein the high-side clamping circuitry is configured to limit to a high-side clamping voltage the voltage drop between the supply voltage node and the intermediate node;
low-side clamping circuitry coupled in parallel to the current flow line through the third low-side transistor, wherein the low-side clamping circuitry is configured to limit to a low-side clamping voltage the voltage drop between the intermediate node and the reference voltage node; and testing circuitry including:
- a test-mode node configured to receive a test-mode signal;
- a testing transistor having a control node coupled to the test-mode node, a first testing transistor node, a second testing transistor node, and a current flowpath between a first testing transistor node and a second testing transistor node; and
- a testing resistance coupled between the first testing transistor node and a control node of the fourth transistor, wherein the testing transistor is configured to drive the fourth transistor in the low-side transistor pair, making non-conductive said current flow line of the third transistor in the low-side transistor pair in response to the test-mode signal having a first value during a first time interval.

2. The circuit of claim 1, wherein the testing circuitry comprises:
- a further testing transistor having a control node coupled to the test-mode node and a current flowpath therethrough between a first testing transistor node coupled to a first current mirror arrangement of transistors and a second testing transistor node coupled to a reference current generator referred to ground, wherein the first current mirror arrangement is configured to provide a mirrored current that is a scaled replica of the current flowing in the current flow path of the further testing transistor, the mirrored current being scaled by a first scale factor; and
- a second current mirror arrangement of transistors coupled to the first current mirror arrangement and to the second transistor in the high-side transistor pair, the second current mirror arrangement configured to provide a further mirrored current that is a scaled replica of the current mirrored by the first current mirror, the further mirrored current being scaled by a second scale factor,
- wherein the further testing transistor is configured to drive the second transistor in the high-side transistor pair, making non-conductive said current flow path between said supply voltage node and said intermediate node in response to the test-mode signal having a first value during a first time interval.

3. The circuit of claim 2, wherein the second current mirror comprises a limiting resistance coupled intermediate the second current mirror arrangement and said intermediate node.

4. The circuit of claim 1, wherein the high-side clamping circuitry and the low-side clamping circuitry each comprise:
- a chain of Zener diodes coupled either between said supply voltage node and said intermediate node or between said intermediate node and said reference voltage node; and
- a resistance coupled in parallel with a last Zener diode in the chain of Zener diodes.

5. A method of operating the circuit of claim 1, the method comprising:
- applying a test-mode signal to said test-mode node, the test-mode signal having a first value during a first time interval, and
- applying a stress voltage level to at least one of said second transistor in the high-side transistor pair and fourth transistor in the low-side transistor pair during the first time interval in which the test-mode signal has the first value, wherein the stress voltage level is above either the low-side or the high-side clamping voltage.

6. The method of claim 5, further comprising limiting the amount of current that flows into the low-side or the high-side clamping circuitry and the testing circuitry during the first time interval in which the test-mode signal has the first value.

7. A device, comprising:
a circuit, including:
- a high-side transistor pair and a low-side transistor pair having a common intermediate node, the high-side transistor pair including:
  - a first transistor having a control node and a current flowpath therethrough configured to provide a current flow line between a supply voltage node and the intermediate node; and
  - a second transistor having a current flowpath therethrough coupled to the control node of the first transistor,
- the low-side transistor pair including:
  - a third transistor having a control node and a current flowpath therethrough configured to provide a current flow line between the intermediate node and the reference voltage node; and
  - a fourth transistor having a current flowpath therethrough coupled to the control node of the third transistor,
- wherein the high-side transistor pair and the low-side transistor pair are configured to supply an inductive load coupled either between the supply voltage node and the intermediate node or between the intermediate node and the reference voltage node;
- a drive node configured to receive a switching drive signal, the drive node coupled to the control node of the first transistor in the high-side transistor pair and to the control node of the third transistor in the low-side transistor pair wherein the switching drive signal is applied with opposite polarities to the control node of the first transistor and to the control node of the third transistor;
- high-side clamping circuitry coupled in parallel to the current flow line through the first high-side transistor, wherein the high-side clamping circuitry is configured to limit to a high-side clamping voltage the voltage drop between the supply voltage node and the intermediate node;
- low-side clamping circuitry coupled in parallel to the current flow line through the third low-side transistor, wherein the low-side clamping circuitry is configured to limit to a low-side clamping voltage the voltage drop between the intermediate node and the reference voltage node; and
- testing circuitry including:
  - a test-mode node configured to receive a test-mode signal;
  - a testing transistor having a control node coupled to the test-mode node, a first testing transistor node, a second testing transistor node, and a current flowpath between a first testing transistor node and a second testing transistor node, and
  - testing resistance coupled between the first testing transistor node and a control node of the fourth transistor, wherein the testing transistor is configured to drive the fourth transistor in the low-side transistor pair, making non-conductive said current flow line of the third transistor in the low-side transistor pair in response to the test-mode signal having a first value during a first time interval;

an inductive load coupled either between said supply voltage node and said intermediate node or between said intermediate node and said reference voltage node;
an electrical supply source configured to provide a voltage supply level coupled to said supply voltage node of the circuit;
a stress voltage source configured to provide a stress voltage level either above the high-side clamping voltage or the low-side clamping voltage to at least one said supply voltage node and said intermediate node; and
signal generating circuitry configured to provide said test-mode signal to said test-mode node.

8. The device of claim 7, wherein the low-side transistor pair and the high-side transistor pair are coupled to the inductive load at said intermediate node and form a flyback circuit arrangement.

9. The device of claim 7, wherein the device is an energy management system (EMS) unit configured to manage energy of a vehicle.

10. The device of claim 7, wherein the testing circuitry comprises:
a further testing transistor having a control node coupled to the test-mode node and a current flowpath therethrough between a first testing transistor node coupled to a first current mirror arrangement of transistors and a second testing transistor node coupled to a reference current generator referred to ground, wherein the first current mirror arrangement is configured to provide a mirrored current that is a scaled replica of the current flowing in the current flow path of the further testing transistor, the mirrored current being scaled by a first scale factor; and
a second current mirror arrangement of transistors coupled to the first current mirror arrangement and to the second transistor in the high-side transistor pair, the second current mirror arrangement configured to provide a further mirrored current that is a scaled replica of the current mirrored by the first current mirror, the further mirrored current being scaled by a second scale factor,
wherein the further testing transistor is configured to drive the second transistor in the high-side transistor pair, making non-conductive said current flow path between said supply voltage node and said intermediate node in response to the test-mode signal having a first value during a first time interval.

11. The device of claim 10, wherein the second current mirror comprises a limiting resistance coupled intermediate the second current mirror arrangement and said intermediate node.

12. The device of claim 7, wherein the high-side clamping circuitry and the low-side clamping circuitry each comprise:
a chain of Zener diodes coupled either between said supply voltage node and said intermediate node or between said intermediate node and said reference voltage node; and
a resistance coupled in parallel with a last Zener diode in the chain of Zener diodes.

13. An automotive vehicle, comprising:
an energy management system (EMS) device configured to manage energy of the automotive vehicle, the EMS device including:
a circuit, including:
a high-side transistor pair and a low-side transistor pair having a common intermediate node, the high-side transistor pair including:
a first transistor having a control node and a current flowpath therethrough configured to provide a current flow line between a supply voltage node and the intermediate node; and
a second transistor having a current flowpath therethrough coupled to the control node of the first transistor,
the low-side transistor pair including:
a third transistor having a control node and a current flowpath therethrough configured to provide a current flow line between the intermediate node and the reference voltage node; and
a fourth transistor having a current flowpath therethrough coupled to the control node of the third transistor,
wherein the high-side transistor pair and the low-side transistor pair are configured to supply an inductive load coupled either between the supply voltage node and the intermediate node or between the intermediate node and the reference voltage node;
a drive node configured to receive a switching drive signal, the drive node coupled to the control node of the first transistor in the high-side transistor pair and to the control node of the third transistor in the low-side transistor pair wherein the switching drive signal is applied with opposite polarities to the control node of the first transistor and to the control node of the third transistor;
high-side clamping circuitry coupled in parallel to the current flow line through the first high-side transistor, wherein the high-side clamping circuitry is configured to limit to a high-side clamping voltage the voltage drop between the supply voltage node and the intermediate node;
low-side clamping circuitry coupled in parallel to the current flow line through the third low-side transistor, wherein the low-side clamping circuitry is configured to limit to a low-side clamping voltage the voltage drop between the intermediate node and the reference voltage node; and
testing circuitry including:
a test-mode node configured to receive a test-mode signal;
a testing transistor having a control node coupled to the test-mode node a first testing transistor node, a second testing transistor node, and a current flowpath between a first testing transistor node and a second testing transistor node; and
a testing resistance coupled between the first testing transistor node and a control node of the fourth transistor, wherein the testing transistor is configured to drive the fourth transistor in the low-side transistor pair, making non-conductive said current flow line of the third transistor in the low-side transistor pair in response to the test-mode signal having a first value during a first time interval;
an inductive load coupled either between said supply voltage node and said intermediate node or between said intermediate node and said reference voltage node;
an electrical supply source configured to provide a voltage supply level coupled to said supply voltage node of the circuit;

a stress voltage source configured to provide a stress voltage level either above the high-side clamping voltage or the low-side clamping voltage to at least one said supply voltage node and said intermediate node; and signal generating circuitry configured to provide said test-mode signal to said test-mode node.

14. The automotive vehicle of claim 13, wherein the testing circuitry comprises:

a further testing transistor having a control node coupled to the test-mode node and a current flowpath therethrough between a first testing transistor node coupled to a first current mirror arrangement of transistors and a second testing transistor node coupled to a reference current generator referred to ground, wherein the first current mirror arrangement is configured to provide a mirrored current that is a scaled replica of the current flowing in the current flow path of the further testing transistor, the mirrored current being scaled by a first scale factor; and a second current mirror arrangement of transistors coupled to the first current mirror arrangement and to the second transistor in the high-side transistor pair, the second current mirror arrangement configured to provide a further mirrored current that is a scaled replica of the current mirrored by the first current mirror, the further mirrored current being scaled by a second scale factor, wherein the further testing transistor is configured to drive the second transistor in the high-side transistor pair, making non-conductive said current flow path between said supply voltage node and said intermediate node in response to the test-mode signal having a first value during a first time interval.

15. The automotive vehicle of claim 14, wherein the second current mirror comprises a limiting resistance coupled intermediate the second current mirror arrangement and said intermediate node.

16. The automotive vehicle of claim 13, wherein the high-side clamping circuitry and the low-side clamping circuitry each comprise:

a chain of Zener diodes coupled either between said supply voltage node and said intermediate node or between said intermediate node and said reference voltage node; and a resistance coupled in parallel with a last Zener diode in the chain of Zener diodes.

\* \* \* \* \*

UNITED STATES PATENT AND TRADEMARK OFFICE
CERTIFICATE OF CORRECTION

PATENT NO. : 11,979,143 B2
APPLICATION NO. : 17/870173
DATED : May 7, 2024
INVENTOR(S) : Nicola Errico et al.

Page 1 of 1

It is certified that error appears in the above-identified patent and that said Letters Patent is hereby corrected as shown below:

In the Claims

Column 16, Claim 7, Line 60:
"testing resistance"
Should read:
--a testing resistance--.

Signed and Sealed this
Ninth Day of July, 2024

Katherine Kelly Vidal
*Director of the United States Patent and Trademark Office*